United States Patent [19]

Bernardoni et al.

[11] Patent Number: 5,278,726
[45] Date of Patent: Jan. 11, 1994

[54] METHOD AND APPARATUS FOR PARTIALLY OVERMOLDED INTEGRATED CIRCUIT PACKAGE

[75] Inventors: Lonnie L. Bernardoni, Coral Springs; Thomas J. Swirbel, Davie; John K. Arledge, Lauderhill, all of Fla.

[73] Assignee: Motorola, Inc., Schaumburg, Ill.

[21] Appl. No.: 824,136

[22] Filed: Jan. 22, 1992

[51] Int. Cl.$^5$ ............................................. H05K 7/02
[52] U.S. Cl. .................................... 361/783; 174/52.2; 174/259; 257/782; 257/787; 257/673; 361/748; 361/767; 361/808
[58] Field of Search ............... 361/395, 397, 400, 401, 361/402, 403, 411, 417, 418; 228/180.2; 257/778, 782, 787, 789, 666, 670, 673; 174/52.2, 259

[56] References Cited

U.S. PATENT DOCUMENTS

| | | | |
|---|---|---|---|
| 3,903,590 | 9/1975 | Yokogawa | 29/577 |
| 4,199,777 | 4/1980 | Maruyama et al. | 357/55 |
| 5,091,769 | 2/1992 | Eichelberger | 357/72 |

Primary Examiner—Leo P. Picard
Assistant Examiner—Young S. Whang
Attorney, Agent, or Firm—Dale W. Dorinski; Pablo Meles

[57] ABSTRACT

A partially overmolded integrated circuit package (10) comprises a substrate (14) having circuit traces (11) and a semiconductor die receiving area (15) for attachment of a semiconductor die to the semiconductor die receiving area. Conductive bumps (18) are then applied to a plurality of contact pads on the semiconductor die. Then overmolding compound (16) is applied over the semiconductor die and a portion of the conductive bumps, leaving a portion of the conductive bumps partially exposed (19). Finally, interconnections (13) between the exposed portion of the conductive bumps and the circuit traces of the substrate are formed.

18 Claims, 2 Drawing Sheets

METHOD AND APPARATUS FOR PARTIALLY OVERMOLDED INTEGRATED CIRCUIT PACKAGE

TECHNICAL FIELD

This invention relates generally to the overmolding of integrated circuit packages, and more particularly to a method and apparatus for partially overmolding a integrated circuit (IC) package leaving expose die contacts

BACKGROUND

Wirebonding in integrated circuit packages is one of the sources of intensive labor and of yield defects. Furthermore, conventional chip-on-board packages and overmolded pad array carriers (OMPAC) have a profile or thickness that could be reduced. The cost of manufacturing flip chip and chip-on-board packages could be reduced if fine pitched lines and spaces were not required on a printed circuit board. Both flip chip and chip-on-board packages require fine pitched printed circuit boards or substrates. Further expense is found in the requirement of gold plating for wirebonding on chip-on-board packages.

Flip-chip and chip-on-board packages also have mechanical and electrical disadvantages. For instance, with flip-chip packages there are tiny solder joints and heat dissipation problems. With chip-on-board packages and other packages requiring wirebonding, electrical characteristics may vary due to the flexibility of conductor widths and materials and the inconsistency of wire lengths. Finally, many packages require the extra step of passivating die pad surface. Therefore, a need exists for a smaller profiled IC package that does not require fine pitched printed circuit boards or gold plating for wirebonding. Furthermore, a need exists for an IC package that has excellent mechanical and electrical characteristics that does not require passivation for die pads and overcomes the problems described above.

SUMMARY OF THE INVENTION

A partially overmolded integrated circuit package comprises a substrate having circuit traces and a semiconductor die receiving area for attachment of a semiconductor die to the semiconductor die receiving area. Conductive bumps are then applied to a plurality of contact pads on the semiconductor die. Then overmolding compound is applied over the semiconductor die and a portion of the conductive bumps, leaving a portion of the conductive bumps partially exposed. Finally, interconnections between the exposed portion of the conductive bumps and the circuit traces of the substrate are formed.

DETAILED DESCRIPTION OF THE PREFERRED EMBODIMENT

Figure 1:
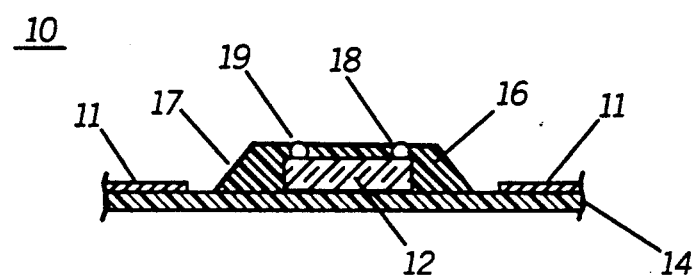
FIG. 1 is a side view of a partially overmolded IC package in accordance with the present invention.
Figure 2:
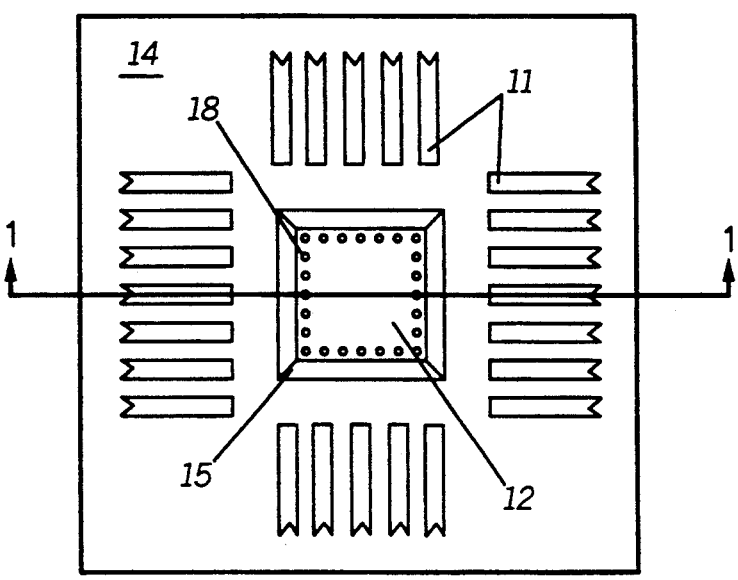
FIG. 2 is a top plan view of the IC package after attachment of a die to a substrate, but before overmolding in accordance with the present invention.
Figure 3:
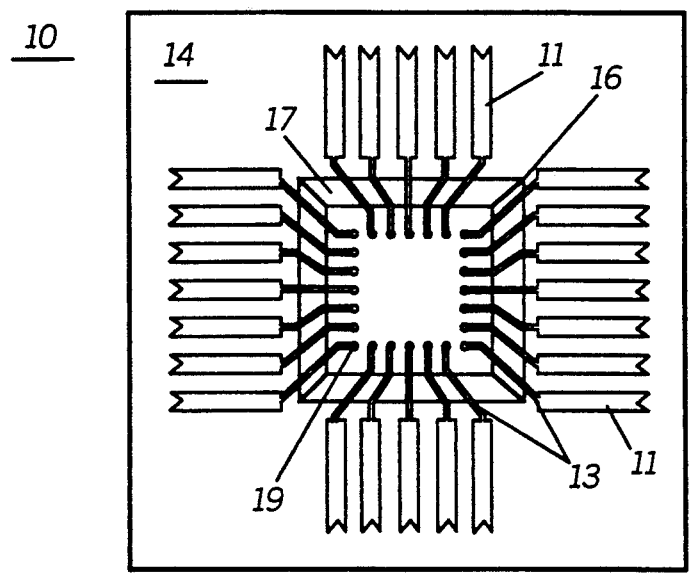
FIG. 3 is another top plan view of the IC package after overmolding and forming thin film connections in accordance with the present invention.

Referring to FIG. 1 there is shown a side view of a partially overmolded IC package 10 in accordance with the present invention. The package 10 comprises a semiconductor die or integrated circuit 12 attached to a substrate 12. Preferably, the substrate 14 is a printed circuit board having preprinted circuit runners or traces 11. Referring to FIGS. 1 and 2, the die 12 is preferably attached to the semiconductor die receiving area 15 of the substrate 14 using conventional die bonding adhesives such as epoxy (not shown). Conductive bumps 18 are then attached to the die contact pads (not shown) of the semiconductor die 12. The conductive bumps are preferably made of gold balls and could be attached to the die contact pads by using a wirebonder, but other suitable alternative means of applying the conductive bumps could be used. The gold bumps are preferably between the height of 6 and 9 mils above the die before the molding compound is placed on the substrate and die. The mold compound on the die is preferably 5 mils thick allowing the exposure of a portion of the bump. Preferably, 75 percent of the bump diameter is exposed. Referring to FIGS. 1 and 3, once the conductive bumps 18 are set in place, the semiconductor die 12 and the conductive bumps 18 are overmolded (16) preferably using a thermoset epoxy molding compound. The overmolding 16 is done in such a manner as to leave a portion (19) of the conductive bumps 18 exposed. Additionally, the exposed bumps are typically flattened as shown in FIG. 1. Furthermore, the overmolding is preferably formed having sloped sides to easily allow photolithography in a subsequent step. The sloped sides of the overmolding are typically a 45 degree angle and thus extend to 25 mils above the bottom edge of the die, whereas a typical chip on board package would have a 50 mil thickness. After the overmolding covers the die 12 and conductive bumps 18 (except for the exposed contact portion 19), interconnections 13 are formed between the contact portion 19 and the circuit traces 11. Preferably, the circuit connections are formed using standard thin film photolithographic procedures in either an additive or subtractive process. In other words, the top and angled surfaces can be sputtered, photo defined, plated and etched to make the connections or alternatively a thickfilm process or direct write process, or a possibly a screen printing process could be used.

Figure 4:
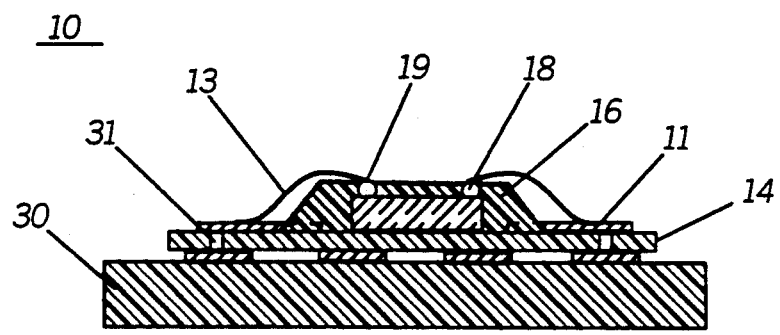
FIG. 4 is a side view of a partially overmolded IC package mounted on a substrate in accordance with the present invention.
Figure 5:
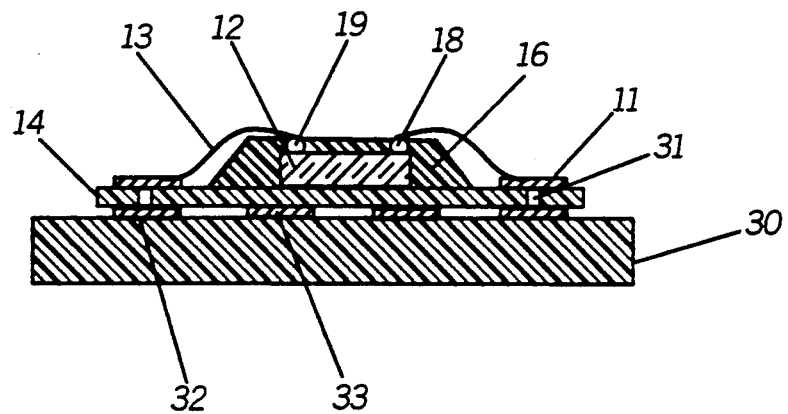
FIG. 5 is a side view of another partially overmolded IC package mounted on a substrate in accordance with the present invention.

Referring to FIGS. 4 and 5, there are shown two side views of two similar partially overmolded IC packages on a substrate 30. In FIG. 4 the package 10 has its overmolding 16 over the die, portions of the substrate 14, and portions of the circuit traces 11. Then, the circuit interconnections 13 are photolithographed from the conductive bumps 18 over the overmolding 16 to the circuit traces 11. Furthermore, the package 10 could be places on another substrate or printed circuit board 30 having circuit traces 32 and 33. Optionally, the substrate 14 has throughholes 31 to allow interconnections between circuit traces 11 and the circuit traces 32. FIG. 5 shows a similar structure to the one shown in FIG. 4 except that the overmolding does not cover the circuit traces 11 as shown in FIG. 3. In the package of FIG. 5, the circuit interconnections 13 are photolithographed from the conductive bumps 18 over the overmolding 16 and over a portion of the substrate 14 to the conductive traces 11.

The advantages of the present invention are quite apparent. The thickness or profile of the present invention is typically more than 50 mils less than other IC packages. For instance, OMPAC packages typically have a 78 mil thickness above their printed circuit boards whereas the present invention can have a 25 mil total thickness. The cost savings of the present invention over other packages are numerous. for instance, the partially overmolded IC package of the present invention does not require fine pitched circuit runners and spaces on the printed circuit board since the thin film conductors provide the fine pitch connection requirements. The present invention does not require gold plating for wirebonding. Merely a clean copper surface is suitable for the present invention. The need for passivation of the die pad interface as is done in flip chip packages is eliminated since the overmolding compound (16) over the die (12) surface acts as a passivation for the gold ball die pad interface. The present invention has superior mechanical and electrical properties since the entire backside of the die is directly attached to the printed circuit board 14. Therefore, there are no tiny solder joints or heat dissipation problems. Also, better electrical characteristics than wirebonded packages are achieved since wires are flexible and have inconsistent lengths and widths.

What is claimed is:

1. A method for forming a partially overmolded integrated circuit package, comprising the steps of:
   (a) providing a substrate having conductive circuit runners;
   (b) attaching a semiconductor die having contact pads to the substrate;
   (c) applying conductive bumps to the contact pads of the semiconductor die;
   (d) transfer molding a resin over the semiconductor die and a first lower portion of each conductive bump, so as to leave a second upper portion of each conductive bump exposed and elevated above the uppermost surface of the transfer molded resin;
   (e) electrically interconnecting the second upper portion of each conductive bump to the conductive circuit runners.

2. The method of claim 1, wherein said conductive bumps are comprised of gold.

3. The method of claim 1, wherein said transfer molded resin is a thermoset epoxy molding compound.

4. The method of claim 1, wherein said transfer molded resin has sloped sides to allow for photolithography.

5. The method of claim 1, wherein said conductive bumps are coupled to the circuit runners of the substrate using thin film photolithography.

6. The method of claim 1, wherein said method further comprises the step of flattening the conductive bump.

7. A partially overmolded integrated circuit package, comprising:
   a substrate having circuit traces and a semiconductor die receiving area;
   a semiconductor die having contact pads, for placement on the semiconductor die receiving area;
   means for attaching the semiconductor die to the substrate;
   conductive bumps applied to the contact pads of the semiconductor die;
   transfer molded resin over the semiconductor die and a first lower portion of the conductive bumps, leaving a second upper portion of the conductive bumps partially exposed and elevated above the uppermost surface of the transfer molded resin;
   interconnections between the second upper portion of the conductive bumps and the circuit traces of the substrate.

8. The package of claim 7, wherein said conductive bumps are comprised of gold.

9. The package of claim 7 wherein said overmolding compound comprises a thermoset epoxy molding compound.

10. The package of claim 7, wherein said transfer molded resin is formed to have sloped sides to allow for photolithography.

11. The package of claim 7, wherein said conductive bumps are coupled to the circuit traces of the substrate with thin film metallization.

12. The package of claim 7, wherein said conductive bumps are flattened.

13. A partially overmolded integrated circuit package, comprising:
   a printed circuit board having conductive circuit traces and a semiconductor die receiving area;
   a semiconductor die attached to the semiconductor die receiving area, said semiconductor die having contact pads;
   conductive bumps applied to the contact pads of the semiconductor die;
   transfer molded resin over the semiconductor die and a first lower portion of the conductive bumps, leaving a second upper portion of the conductive bumps partially exposed and elevated above the uppermost surface of the transfer molded resin, and the transfer molded resin not covering the substrate conductive circuit traces; and
   thin film interconnections between the second upper portion of the conductive bumps and the substrate conductive circuit traces.

14. The package of claim 13, wherein said conductive bumps are comprised of gold.

15. The package of claim 13 wherein said transfer molded resin comprises a thermoset epoxy molding compound.

16. The package of claim 13, wherein said transfer molded resin is formed to have sloped sides to allow for photolithography.

17. The package of claim 13, wherein said conductive bumps are coupled to the circuit traces of the substrate with thin film metallization.

18. The package of claim 13, wherein said conductive bumps are flattened.

* * * * *